(12) United States Patent  
Iulita

(10) Patent No.: US 6,639,224 B2  
(45) Date of Patent: Oct. 28, 2003

(54) SPECIMEN-CARRIER ACCESSORY DEVICE FOR THE STEREOSCOPIC ANALYSIS BY A SCANNING ELECTRON MICROSCOPE

(75) Inventor: Piero Iulita, Sangano (IT)

(73) Assignee: Fiat Auto S.p.A., Turin (IT)

( * ) Notice: Subject to any disclaimer, the term of this patent is extended or adjusted under 35 U.S.C. 154(b) by 105 days.

(21) Appl. No.: 09/742,360

(22) Filed: Dec. 22, 2000

(65) Prior Publication Data

US 2001/0006213 A1 Jul. 5, 2001

(30) Foreign Application Priority Data

Dec. 23, 1999 (IT) ........................................ TO990226 U

(51) Int. Cl.$^7$ ............................ H01J 37/20; H01J 37/26
(52) U.S. Cl. ............................. 250/440.11; 250/442.11; 250/310; 250/491.1
(58) Field of Search ...................... 250/440.11, 442.11, 250/310, 491.1

(56) References Cited

U.S. PATENT DOCUMENTS 3,629,577 A * 12/1971 Weber et al. ............. 250/49.5 A
4,170,737 A   10/1979 Bobrov et al. ............... 250/442
5,149,967 A *  9/1992 Otaka ......................... 250/310

FOREIGN PATENT DOCUMENTS

JP      63 307653 A    12/1888

* cited by examiner

Primary Examiner—Nikita Wells
(74) Attorney, Agent, or Firm—Sughrue Mion, PLLC

(57) ABSTRACT

The device is connectable to a specimen-carrier table of non-eucentric type for the acquisition, by means of a scanning electron microscopic, of images taken in an angularly offset manner for stereoscopic examination of a specimen. A specimen-carrier table comprises a support member which is translatable along a first, vertical axis, as well as along a second and a third horizontal axis of which one is parallel and the other orthogonal to the interocular direction of the observer, and is turnable about its own axis as well as about the second axis. The accessory device comprises a support structure of metal material having a connection portion which allows fixing to the Movable member of the specimen-carrier table, as well as a support portion having a support surface which, when the said structure is coupled to the movable member of the table, lies in a plane parallel to the said axis of rotation, in such a way that after rotation of the movable member of the table through 90° about the said second axis, a subsequent rotation of the said movable member about its axis is able to cause the said surface to turn about the said third axis.

5 Claims, 3 Drawing Sheets

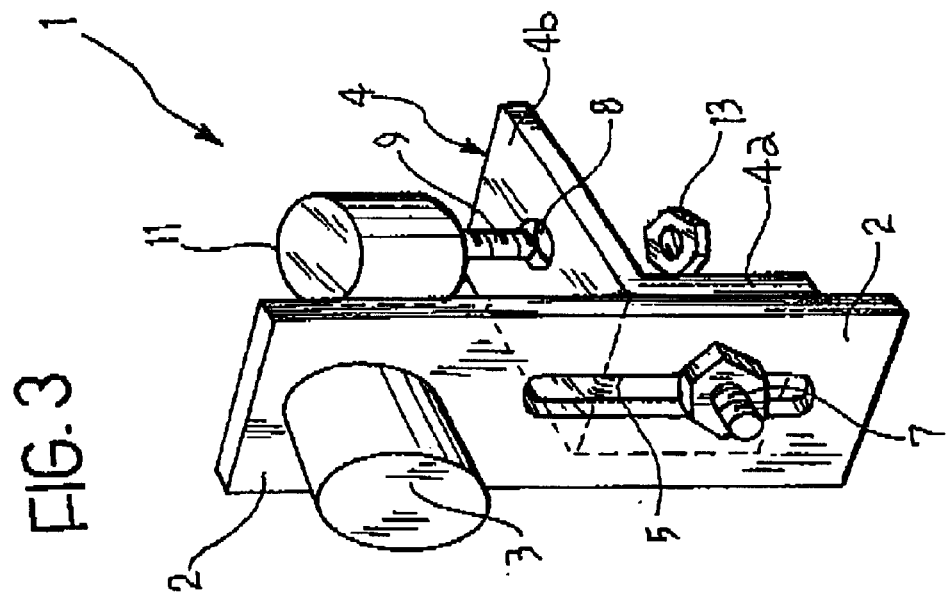
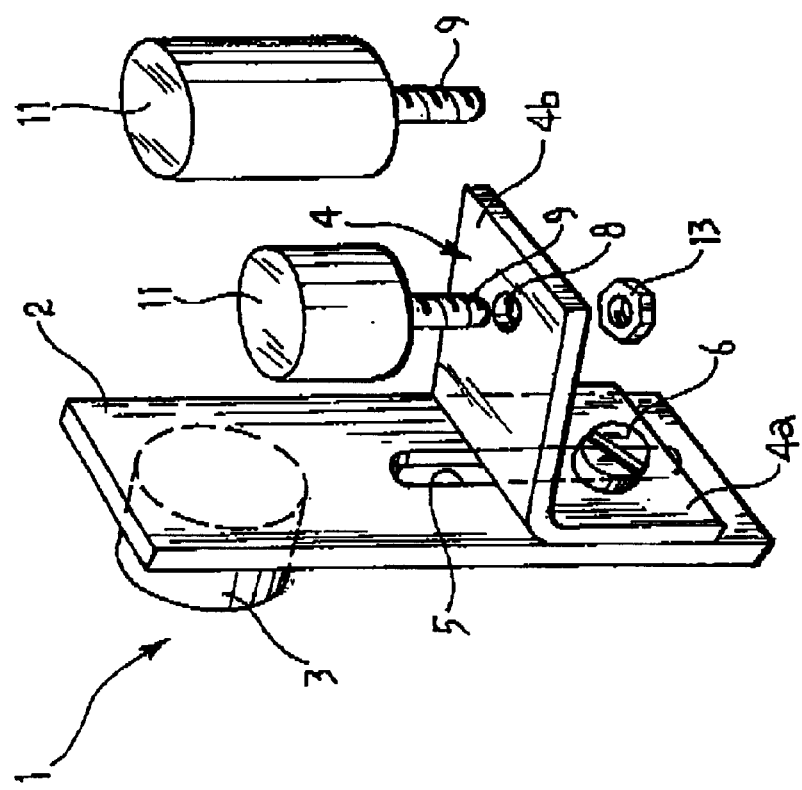

SPECIMEN-CARRIER ACCESSORY DEVICE FOR THE STEREOSCOPIC ANALYSIS BY A SCANNING ELECTRON MICROSCOPE

BACKGROUND OF THE INVENTION

The present invention relates to an accessory device connectable to a specimen-carrier table of the non-eucentric type for the acquisition, by means of a scanning electron microscope, of images taken in an angularly offset manner for stereoscopic examination of a specimen.

Stereoscopic analysis by scanning electron microscope makes it possible to effect measurement in three dimensions and to detect, for example, the roughness parameters of irregular surfaces with very high magnification.

Stereoscopic analysis permits observation of a specimen with a perspective view, and in anaglyph (with three-dimensional vision by means of the use of suitable glasses). This latter possibility allows an immediate "reading" of the surface morphology of the specimen, making it possible to overcome the difficulties which often arise in the distinction between ridges and valleys of the surface of specimens under analysis.

In general, as is known, the process of stereoscopic analysis involves the acquisition of two images of the specimen, obtained by turning the specimen about a horizontal axis essentially orthogonal to the interocular line of the observer. These images are then superimposed. By means of a processor for the treatment and presentation of images, provided with suitable software, the anaglyph is presented on a display. The processor further allows a calculation of the microroughness parameters.

For stereoscopic analysis with scanning electron microscope a specimen-carrier table of eucentric type is sometimes utilised, which allows six degrees of freedom in the movement and which is formed in such a way as to maintain the position of the point of impact between the electron beam and the specimen essentially unaltered, even upon variation of the spatial co-ordinates of this latter. This property, and the possibility of turning the specimen, by rotation about the Y axis, of obtaining three dimensional stereoscopic analysis is particularly easy and rapid in that the two images detected with different angles of inclination of the electron beam do not require any movements along the X, Y and Z axes for their superimposition.

Specimen-carrier tables of eucentric type are however extremely expensive. For this reason scanning electron microscopes are very often provided with a non-eucentric table, which is rather more economical.

Specimen-carrier tables of non-eucentric type do not allow turning of the specimen about the Y axis, which operation is necessary for taking stereoscopic images. Nor is it possible to maintain unaltered the position of the point of incidence of the electron beam on the specimen upon variation of the spatial co-ordinates of this latter.

In view of the above, stereocscopic analysis with a specimen-carrier table of non-eucentric type is extremely laborious. It requires electronic rotation of the image through 90°, which then makes it possible to rotate the specimen in a virtual manner about the Y axis by acting on the rotation command about the X axis. The exchange of movements about the X and Y axes renders this manoeuvre unnatural and therefore difficult, in particular when working at very high magnifications.

SUMMARY OF THE INVENTION

The object of the present invention is to provide a device which allows stereoscopic images to be taken in an easy manner using a non-eucentric specimen-carrier table.

This object is achieved according to the invention with an accessory device comprising a support structure distinct and separate with respect to said specimen-carrier table, said support structure being comprised of metal material having a connection portion for detachably connecting the support structure to the movable member of the specimen-carrier table, and a support portion having a support surface which, when the structure is coupled to the movable member of the table, extends in a plane parallel to the axis of rotation in such a way that, after rotation of the movable member of the table through 90° about the second axis, a subsequent rotation of the movable member about its own axis is able to cause the surface to turn about the third axis.

BRIEF DESCRIPTION OF THE DRAWINGS

Further characteristics and advantages of the invention will become apparent from the detailed description which follows, given purely by way of non-limitative example, with reference to the attached drawings, in which;

FIGS. 2 and 3 are perspective views of an accessory device according to the invention.

DETAILED DESCRIPTION OF THE INVENTION

Figure 1:
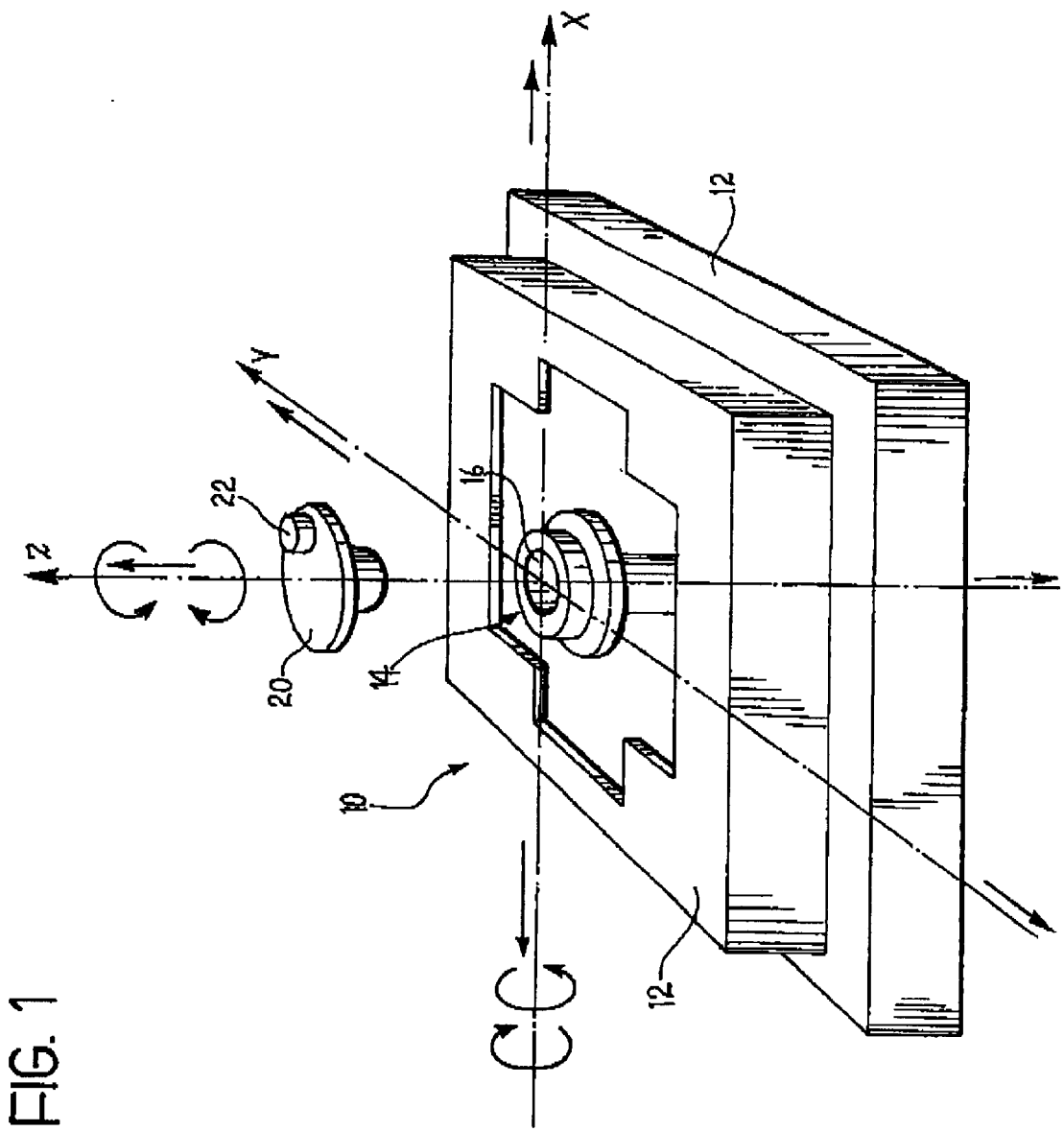
FIG. 1 is an extremely schematic representation, in perspective view, of a non-eucentric specimen-carrier table.

In FIG. 1 the reference numeral 10 generally indicates a non-eucentric specimen-carrier table. In a manner known per se the table 10 comprises a stationary support structure 12 and a support member 14 which is movable with respect to it. In the exemplary embodiment illustrated the support member 14 has a cylindrical socket 16 in which a cylindrical stem 18 projecting from a disc 20 can be engaged and fixed, the disc having on the opposite side a cylindrical block 22 intended to support a specimen.

In a manner known per se, by means of actuator devices not illustrated, the support member 14 is translatable along three, mutually orthogonal, co-ordinate axes indicated X, Y and Z. This member is, moreover, rotatable about its own axis, which in the rest position illustrated in FIG. 1 coincides with the 2 axis.

The support member 14 is further turnable about the horizontal X axis which is conventionally parallel to the interocular line of the observer.

Figure 4:
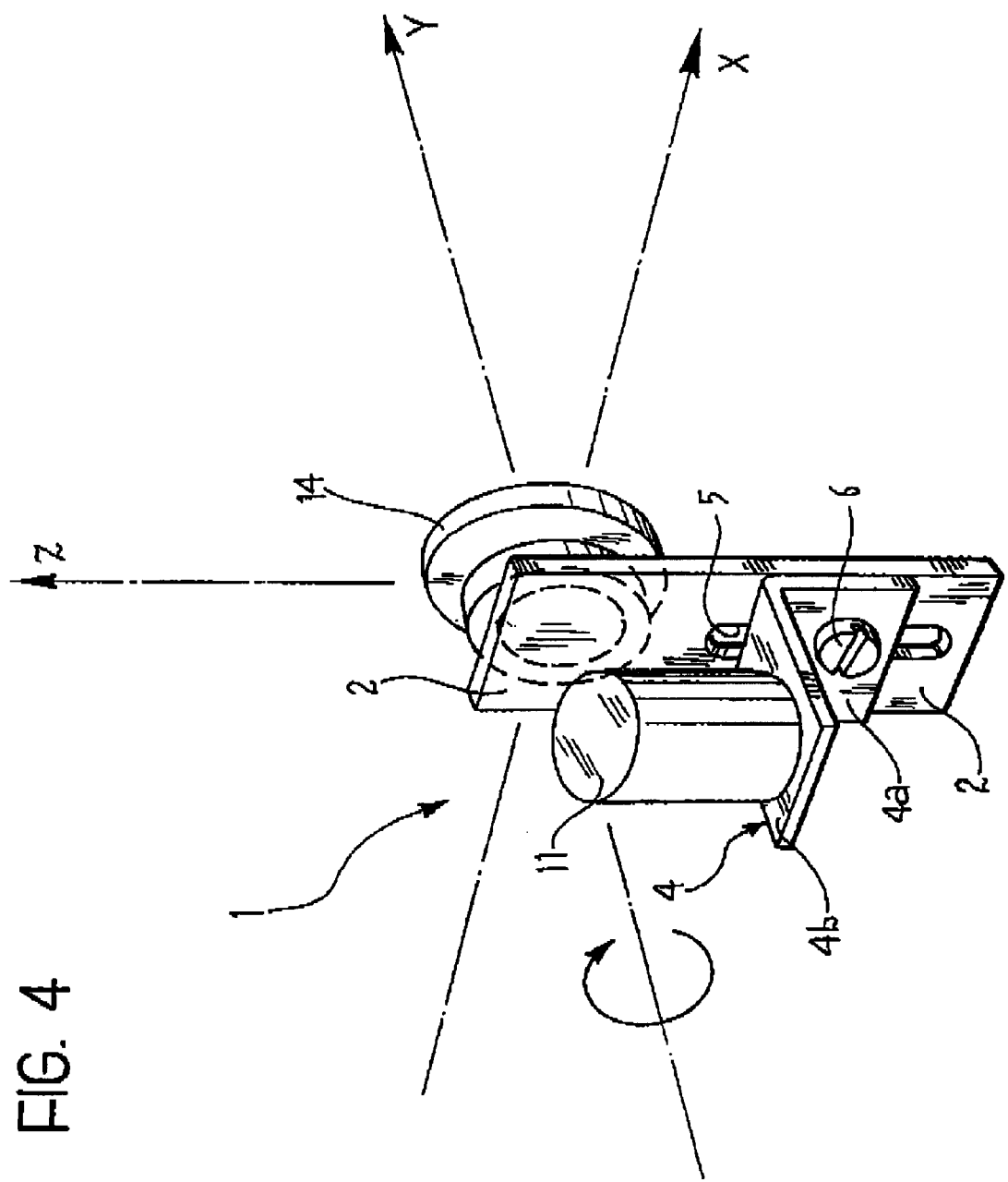
FIG. 4 is a perspective view which shows a device according to the invention coupled to the movable member of a non-eucentric specimen-carrier table in conditions of use for taking stereoscopic images.

In FIGS. 2 to 4 the reference numeral 1 generally indicates an accessory device according to the invention. This device, in the exemplary embodiment illustrated, comprises a small, essentially rectangular metal plate 2 from a main face of which extends a cylindrical boas 3 which can be introduced into and fixed in the socket 16 of the movable support member 14 of the specimen-carrier table. The accessory device 1 further includes a substantially L-shaped support bracket 4 having one arm 4a fixed to the small plate 2 in an adjustable position. To this end the plate 2 is provided with a slit or slot 5 along which the bracket 4 is adjustable and fixable by means of a screw member 6 and an associated clamping nut 7.

The bracket 4 has a second arm 4b which extends orthogonally with respect to the first arm 4a and therefore to the plate 2. A hole 8 is formed in the arm 4b of the bracket in which hole is engageable a threaded shank 9 which extends from the lower base of a preferably cylindrical block 11 intended to be utilised for supporting a specimen in the performance of the stereoscopic analysis.

The accessory device 1 can possibly be equipped with a plurality of specimen-carrier blocks 11 having different heights and interchangeable with one another like the two blocks illustrated in FIG. 2.

A nut 13 screwed on the threaded shank 9 of the block 11 projecting beneath the arm 4b of the bracket 4 makes it possible stably to fix the selected block 11 to the bracket 4, moreover establishing electrical continuity of the block 11 with the entire accessory device 11 as is necessary for analysis by scanning electron microscopes.

For the acquisition of images taken in an angularly offset manner for stereoscopic analysis of a specimen the movable support member 14 of the specimen-carrier table 10 is preliminarily subjected to a rotation through 90° about the X axis in such a way as to position it as seen in FIG. 4. The above-described accessory device of the invention is then coupled to this member in such a way that the block 11 of this accessory device has its upper base or face lying in a plane parallel to the X, Y plane. The positioning of the bracket 4 and the choice of which specimen-carrier block 11 to use must be made in such a way that the surface of the specimen to be examined, disposed on the block 11, is essentially coplanar with the X, Y plane.

Having positioned the accessory device 1 in this way, as shown in FIG. 4, with the usual command devices (not shown) the movable support member 14 of the specimen-carrier table 10 is caused to rotate about its own axis, and the surface of the specimen under examination turns about the Y axis without becoming spaced from this axis.

Images can then be taken in an angularly offset manner in an extremely simple and rapid manner for subsequent stereoscopic analysis of the surface of the specimen.

The accessory device according to the invention therefore makes it possible to obviate the disadvantages indicated in the introduction to the present description.

Naturally, the principle of the invention remaining the same, the embodiments and details of construction can be widely varied with respect to what has been described and illustrated purely by way of non-limitative example, the invention extending to all embodiments which achieve the same effect by these innovative concepts.

What is claimed is:

1. A specimen-carrier accessory device connectable to a specimen-carrier table of noneucentric type for the acquisition, by means of a scanning electron microscope, of images taken in an angularly offset manner for stereoscopic examination of a specimen;

the specimen-carrier table comprising a support member which is translatable along a first, vertical, axis as well as along a second and a third horizontal axis, of which one is parallel and the other orthogonal to the interocular direction of the observer, and is rotatable about its own axis as well as about the second axis;

the accessory device comprising a support structure distinct and separate with respect to said specimen-carrier table, said support structure being comprised of metal material having a connection portion for detachably connecting the support structure to the movable member of the specimen-carrier table, and a support portion having a support surface which, when the structure is coupled to the movable member of the table, extends in a plane parallel to the axis of rotation in such a way that, after rotation of the movable member of the table through 90° about the second axis, a subsequent rotation of the movable member about its own axis is able to cause the surface to turn about the third axis.

2. An accessory device according to claim 1, wherein the structure comprises a plate having a projection fixable in the movable support member of the specimen-carrier table, and a substantially L-shaped support bracket one arm of which is fixed to the plate and the other arm of which extends orthogonally of the said first arm and to the said plate.

3. An accessory device according to claim 2, in which the bracket is fixable to the plate in an adjustable position.

4. An accessory device according to claim 2, in which the second arm of the support bracket is able to receive a block, for example of cylindrical shape intended to support a specimen.

5. An accessory device according to claim 4, equipped with a plurality of interchangeable specimen-carrier blocks having different heights.

* * * * *